United States Patent
Liaw et al.

(10) Patent No.: US 7,054,194 B2
(45) Date of Patent: May 30, 2006

(54) NON-VOLATILE SRAM CELL HAVING SPLIT-GATE TRANSISTORS

(75) Inventors: Shion-Hau Liaw, Hsinchu (TW); Hung-Ming Yang, Pingtung (TW)

(73) Assignee: Brilliance Semiconductor Inc., Hsin-chu (TW)

( * ) Notice: Subject to any disclaimer, the term of this patent is extended or adjusted under 35 U.S.C. 154(b) by 115 days.

(21) Appl. No.: 10/607,200

(22) Filed: Jun. 27, 2003

(65) Prior Publication Data

US 2004/0001373 A1 Jan. 1, 2004

(30) Foreign Application Priority Data

Jun. 28, 2002 (TW) .............................. 91114287 A

(51) Int. Cl.
*G11C 14/00* (2006.01)
(52) U.S. Cl. ............ 365/185.08; 365/154; 365/185.22; 365/185.26; 365/185.29
(58) Field of Classification Search ........... 365/185.08, 365/185.01, 154, 185.22, 185.26, 185.29
See application file for complete search history.

(56) References Cited

U.S. PATENT DOCUMENTS

| | | | |
|---|---|---|---|
| 5,892,712 A * | 4/1999 | Hirose et al. | 365/185.07 |
| 6,097,329 A | 8/2000 | Wakayama | |
| 6,222,765 B1 * | 4/2001 | Nojima | 365/8 |
| 6,285,575 B1 * | 9/2001 | Miwa | 365/145 |
| 6,556,487 B1 * | 4/2003 | Ratnakumar et al. | 365/189.08 |

\* cited by examiner

*Primary Examiner*—Connie C. Yoha
(74) *Attorney, Agent, or Firm*—Birch, Stewart, Kolasch & Birch, LLP

(57) ABSTRACT

This specification discloses a non-volatile static random access memory (SRAM) cell with the feature of keeping data even after the power is turned off. It includes a static random access unit and a non-volatile memory unit. Therefore, it has the random access property of the SRAM normally. After the power is turned off, it can store data in the non-volatile memory unit, so that the data can be automatically restored to the static random access unit from the non-volatile memory unit when the power is turned on.

15 Claims, 1 Drawing Sheet

NON-VOLATILE SRAM CELL HAVING SPLIT-GATE TRANSISTORS

BACKGROUND OF THE INVENTION

1. Field of Invention

The invention relates to a static random access memory (SRAM) cell and, in particular, to a non-volatile SRAM cell.

2. Related Art

A digital system usually needs to constantly read and store digital data during operations. Therefore, memory units with the function of keeping data are important elements in realizing a digital system. They can be categorized into the following types: the random access memory (RAM), the serial access memory (SAM), and the content access memory (CAM).

The semiconductor memory is normally a matrix comprised of storage cells. Each cell can store one bit of information. When necessary, data can be arbitrarily stored in or read out from each cell. Therefore, this type of memory is called the random access memory (RAM) to be distinguished from the read only memory (ROM). A main advantage of the RAM is that the access time of each bit in the matrix is the same. However, the drawback is that when the power is turned off, all data will be lost. This phenomenon is described as volatile. That is, when the power is turned off, the data stored in the RAM disappear immediately. On the other hand, the data stored in the ROM can be kept forever and do not disappear with the power shutdown. Consequently, the ROM is also called non-volatile memory. Therefore, according to the storage properties, the memory can be volatile or non-volatile. The biggest difference is that the data stored in the non-volatile memory can be kept even after the power is turned off. Non-volatile memory includes read only memory (ROM), programmable read only memory (PROM), erasable programmable read only memory (EPROM), electric erasable programmable read only memory (EEPROM), and flash memory. The ROM only allows data to be written in and the data cannot be modified. The EPROM requires the use of ultraviolet (UV) light to modify the data. The EEPROM modifies data using voltage changes.

Since the RAM cannot continuously keep its data, a non-volatile SRAM (nvSRAM) is proposed in the prior art to deal with this intrinsic limitation of the RAM. Some hand-held or portable digital products use the battery as its power supply. Once the battery cannot keep supplying power and no backup power source is available, data stored in the memory may be lost. In this case, nvSRAM is an ideal solution. Such an nvSRAM has two parts: one being a static random access memory (SRAM) unit and the other being a non-volatile memory unit. The SRAM part is used to temporarily store data when power is provided. The non-volatile memory unit is used to stored data when the power is discontinued and to restore the data to the SRAM once the power supply is resumed.

An important factor in the research and development of this kind of nvSRAM is that data have to be immediately stored in the non-volatile memory unit before the power completely disappear. Therefore, an nvSRAM that has a rapid storage capability is disclosed. For example, the U.S. Pat. No. 6,097,329, "Non-volatile Static Random Access Memory with High Speed STORE Capability," uses an SRAM cell and an nv cell to make the nvSRAM. A controller is further employed to store data to achieve the goal of high-speed access.

There are already many solutions for the nvSRAM in the prior art. The invention provides a new nvSRAM cell that uses fewer transistors but achieves a faster access speed.

SUMMARY OF THE INVENTION

In summary, an objective of the invention is to provide a non-volatile random access memory (RAM) cell, which combines a static random access memory (SRAM) cell and an electric erasable programmable read only memory (EEPROM) to form a new memory cell. Such a new memory cell has the static random access property in the normal operation environment. Before the power disappears, the data stored in the SRAM cell is moved to the EEPROM cell. When the power supply is resumed, the data are restored to the SRAM cell. Therefore, the data in the SRAM cell are not lost with the power shutdown.

Since the memory chip comprised of static 6T transistor memory units involves the least circuit design details and processing knowledge, it is appropriate for digital systems with less complicated data operating environments. Examples are the memory inside cell phones or hand-held data processing devices. Another reason is that the SRAM made using the CMOS technology has an extremely low power consumption when it is static. It is suitable for being non-volatile memory that uses batteries as the backup power supply.

Another objective of the invention is to provide an nvSRAM cell with high data access speed. As the above-mentioned SRAM unit is a memory structure capable of storing one bit of information and the above-mentioned EEPROM cell has the same memory structure, each bit inside the RAM can be immediately saved in the corresponding EEPROM cell. That is, it has the bit-by-bit non-volatile memory structure. To achieve the above objective, the disclosed nvSRAM cell comprises a SRAM unit and a non-volatile memory unit. The SRAM unit is used to receive one-bit information, keep the one-bit information in an operating environment and transmit the one-bit information in the operating environment. The non-volatile memory unit is connected to the SRAM unit. Before the power disappears, the one-bit information in the SRAM unit is stored in the non-volatile memory unit. After the power is shut down, the one-bit information is kept in the non-volatile memory unit so that it can be restored to the SRAM unit once the power supply is resumed.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

Figure 1:
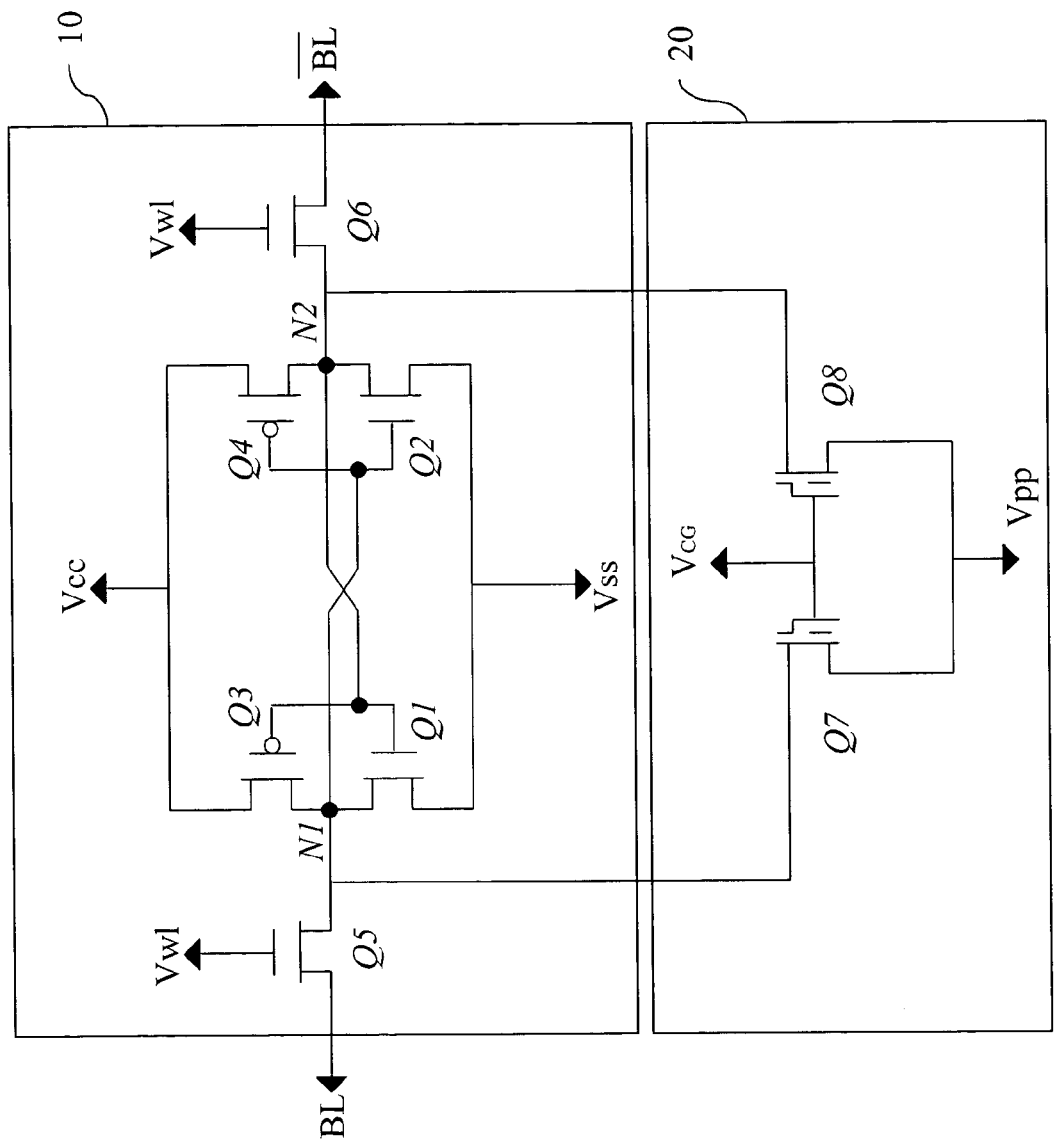
FIG. 1 shows a circuit of the disclosed non-volatile SRAM cell.

To facilitate discussions and reading, we call the static random access memory cell by the SRAM cell and the electric erasable programmable read only memory cell with the memory function by the EEPROM cell. Normally, the memory function is related to the non-volatility. Therefore, we also call the EEPROM cell by the nv cell, where nv is the abbreviation of "non-volatile."

As shown in FIG. 1, the circuit diagram of the disclosed nvSRAM includes an SRAM cell 10 that receives data from the operating environment using a bit line. It is a one-bit memory structure that can temporarily hold the one-bit information. At a later time, it releases information to the external operating environment according to the central processing unit (CPU) command. On the other hand, the nvSRAM also includes an nv cell 20 so that data in the SRAM can be stored before the power completely disappears. After the power is shut down, the data are kept in the nv cell 20, so that they can be restored into the SRAM cell 10 once the power supply is resumed.

As shown in the drawing, the SRAM cell includes six transistors (the first transistor Q1, the second transistor Q2, the third transistor Q3, the fourth transistor Q4, the fifth transistor Q5, and the sixth transistor Q6). It is a six-transistor one-bit memory unit. A pair of CMOS inverters is connected into a flip flop. Memory nodes N1, N2 are connected to a pair of access transistors as the transmission gate. The access transistors are the fifth and sixth transistors Q5, Q6. The gates of the fifth and sixth transistors Q5, Q6 are connected to a word line to perform data reading and writing with the bit line via Q1 and Q2. In particular, Q3, Q4 are p-channel metal oxide semiconductor transistors (pMOS's) and Q1, Q2 are n-channel metal oxide semiconductor transistors (nMOS's). Q1 and Q3, Q2 and Q4 form two CMOS inverters, respectively.

The gates of Q1 and Q3 are connected to the drains of Q2 and Q4. The gates of Q2 and Q4 are connected to the drains of Q1 and Q3. The sources of Q3 and Q4 are connected to a power supply Vcc. Those of Q1 and Q2 are connected to the ground. When data 1 are latched in the SRAM cell 10, Q2 is ON while Q1 is OFF. The node N1 has a voltage Vcc while the node N2 has a voltage 0. That is, when Q1 is OFF and Q2 is ON, there are data 1 stored in the SRAM cell.

The gates of the fifth transistor Q5 and the sixth transistor Q6 are connected to the word line. Their drains (sources) are connected to the nodes N1, N2, respectively. Their sources (drains) are connected to the word line. Q5 and Q6 function like switches. When they are ON, data can be sent out via the word line. Its ON and OFF states are determined by the signal on the word line. When the voltage on the word line is raised to a high level, the access transistors Q5 and Q6 are opened. One-bit information is thus stored or sent out via the word line.

The nv cell 20 contains two split-gate transistors, the seventh transistor and the eighth transistor Q8. They are transistors with the memory function. Data are stored in the floating gate between the gate and base in electric insertion and release means. The control gates of Q7 and Q8 are connected to a voltage Vcg. Their sources are connected to a voltage Vpp. The drain of Q7 is connected to the node N1, while that of Q8 to the node N2.

The reason for using two transistors Q7 and Q8 is because the data in the SRAM cell 10 are stored in N1 and N2. Therefore, two transistors have to be used to represent the corresponding state of N1 and N2.

In the following paragraphs, we further describe the operating means of the whole memory cell. The disclosed nvSRAM cell can use either 3 volts or 5 volts as its working voltage. In the following discussion, we use a 3V power supply as an example.

Let's start from power on. When the power supply is turned on, the control chip first restores the data stored in the nv cell 20 back to the SRAM cell 10.

At this moment, the source voltage Vcc of the transistors Q3 and Q4 is about 1~2 volts, and the word line voltage Vwl=0V, meaning that the SRAM cell 10 is not selected. The voltage at the control gate of the nv cell 20 Vcg=4~6V, and the source voltage Vpp=4~6V. Within the above voltage operating range, the data stored since the last power off will be first restored from the nv cell 20 back to the SRAM cell 10.

After the data are recovered to the SRAM cell 10, the system performs the initialization of the nv cell 20. That is, the data in the nv cell 20 are deleted for storing data in the next time.

Clearing the electrons in the nv cell 20 utilizes the high voltage difference between the floating gate and the source to achieve the goal of having the electrons tunnel through the oxide dielectric layer to the source. This action makes the electrons representing the data disappear from the seventh transistor Q7 and the eighth transistor Q8. The voltage Vcg=−4~6V, the source voltage Vpp=8~10V, the SRAM cell 10 has Vcc=2.5~3.5V, Vss=0V, and the word line voltage Vwl=0V.

The two memory units 10, 20 are two independent memory units. Interference between them has to be avoided during operations. That is, when the SRAM cell 10 performs a random access operation, the nv cell 20 has to maintained in the OFF state. When the nv cell 20 performs storage and restores the data back to the SRAM cell, the SRAM cell has to be in the OFF state. Therefore, when the SRAM performs normal data reading and writing, the control gate voltage Vcg=0V and the drain voltage Vpp is floating or 0V (ground). Since the split gate has a voltage Vcg=0V, the nv cell 20 is in the OFF state without any current flowing through. Thus, the SRAM cell 10 can operate normally.

When the power detector finds that the power disappears, it immediately sends out a storage control signal to notify the nvRAM that the data inside the SRAM cell 10 has to be saved at once.

Storing data from the SRAM cell 10 to the nv cell 20 can be viewed as reading data from the SRAM cell 10 and writing the data into the nv cell 20.

When writing data to the nv cell 20, its control gate voltage Vcg=8~10V, its drain voltage Vpp=4~6V, and the SRAM cell 10 has Vwl=0V and Vcc=2.5~3.5V. The programming operation is performed under these voltage conditions.

When the data stored in the SRAM is 1 (N1 at a high level and N2 at 0V), the voltage at the node N1 Vcc=2.5~3.5V. The voltage difference between Vpp and VN1 is about 0.5~2.5V, which is not sufficient to produce strong thermal carriers. Therefore, no electrons exist on the floating gate of Q7. Q7 is still in the ERASE STATE (meaning that no data exist on the nv cell). On the other hand, Q8 has sufficient Vpp and the voltage difference VN2=4~6V. Strong thermal carriers are produced so that electrons enter the floating gate of Q8. This is called the PROGRAMMING STATE (meaning that the nv cell is written with data). Therefore, when Q7 is in the ERASE STATE and Q8 in the PROGRAMMING STATE, the data 1 is being written in.

When the data in the SRAM is 0 (N1 at 0V and N2 at a high level), the voltage at the node N2 is 2.5~3.5V and the voltage difference between Vpp and VN2 is about 0.5~2.5V. Thus, Q8 is in the ERASE STATE and Q7 in the PROGRAMMING STATE, meaning that data 0 being written in.

As described before, after the power is turned off, data are already copied from the SRAM cell 10 into the nv cell 20 so that data will not be lost with the power shutdown.

Copying data from the nv cell 20 back into the SRAM cell 10 is considered as reading data from the nv cell 20.

Recovery is performed after the power supply is resumed. In the following, we described how data 0 and 1 are restored back to the SRAM cell.

In the beginning, the voltage at the control gate Vcg=4~6V, the source voltage Vpp=4~6V, 的Vwl at the SRAM cell 10 is 0V, and Vcc=1~2V. Since Vcg=4~6V only, no writing operation is performed.

When the nv cell 20 stores the data 1, the seventh transistor Q7 is in the ERASE STATE and the eighth transistor Q8 is in the PROGRAMMING STATE. Since no electrons enter Q7, it is thus ON. On the other hand, Q8 has electrons entering, it is OFF. An electric current flows out of Q7, while no current flows out of Q8. The node N1 is charged to a high voltage and N2 stays at a low voltage. This means that the data 1 is recovered back to the SRAM cell 10.

When the nv cell 20 stores the data 0, the eighth transistor Q8 is in the ERASE STATE and the seventh transistor Q7 is in the PROGRAMMING STATE. Since no electrons enter Q8, it is thus ON. On the other hand, Q7 has electrons entering, it is OFF. No electric current flows out of Q7, while an electric current flows out of Q8. The node N1 stays at 0V and N2 is charged to a high voltage. This means that the data 0 is recovered back to the SRAM cell 10.

In summary, the invention provides a new non-volatile SRAM cell that can keep data originally stored in the SRAM cell even after the power is turned off. Since each bit of SRAM cell has a corresponding one-bit memory unit, the data storage and recovery are performed bit-by-bit. This enables rapid data storage and recovery and effectively lowers power consumption.

Certain variations would be apparent to those skilled in the art, which variations are considered within the spirit and scope of the claimed invention.

What is claimed is:

1. A non-volatile static random access memory (SRAM) cell, comprising:
    an SRAM unit, which receives a 1-bit datum, temporarily stores the 1-bit datum, and transmits the 1-bit datum for normal operations; and
    a non-volatile memory unit, which connects to the SRAM unit for storing the 1-bit datum in the SRAM unit before power is turned off (storage operation), keeping the 1-bit datum (storage operation), recovering the 1-bit datum back to the SRAM unit once the power supply is resumed (recovery operation), and erasing the 1-bit after the recovery operation is completed (erase operation), the non-volatile memory unit further including two split-gate transistors, each of the split-gate transistors including a control gate, a source and a drain, the control gates of the split-gate transistors being connected, the sources of the split-gate transistors being connected and having a same voltage level, the drains of the split-gate transistors storing the 1-bit datum in the SRAM unit;
    wherein a voltage on the control gates of the split-gate transistors is higher than that a voltage on the sources of the split-gate transistors during the storage operation.

2. The non-volatile SRAM cell of claim 1, wherein the SRAM unit further comprises a pair of inverters and two n-channel metal oxide semiconductor field effect transistors (nMOSFET's), the gates of the nMOSFET's connecting to a word line.

3. The non-volatile SRAM cell of claim 1, wherein the voltage on the control gates of the split-gate transistors is lower than 0V and the voltage on sources of the split-gate transistors is higher than 5V during the erase operation.

4. The non-volatile SRAM cell of claim 1, wherein the voltage on the control gates of the split-gate transistors is 0V and the voltage on the sources of the split-gate transistors is 0V during the normal operation.

5. The non-volatile SRAM cell of claim 1, wherein the voltage on the control gates of the split-gate transistors is equal to the voltage on the sources of the split-gate transistors during the recovery operation.

6. The non-volatile SRAM cell of claim 1, wherein a voltage on the word line of the SRAM unit is pulled down to a low level during the recovery operation, the erase operation, and the storage operation.

7. A non-volatile static random access memory (SRAM) cell, comprising:
    an SRAM unit, which comprises a first transistor, a second transistor, a third transistor, a fourth transistor, a fifth transistor, and a sixth transistor, wherein the first transistor and the third transistor form a first inverter, the second transistor and the fourth transistor form a second inverter, the gates of the first transistor and the third transistor are connected to the drains of the fourth transistor and the sixth transistor, the gates of the second transistor and the fourth transistor are connected to the drains of the first transistor, the third transistor, and the fifth transistor, and the gates of the fifth transistor and the sixth transistor are connected with a word line; and
    a non-volatile memory unit, which connects to the SRAM unit and comprises a seventh transistor and an eighth transistor, the seventh transistor and the eighth transistor being split-gate transistors, each of the split-gate transistors including a control gate, a source and a drain, the sources of the seventh and eight transistors being connected and having a same voltage level, the control gates of the seventh transistor and the eighth transistor being connected, the drain of the seventh transistor and the drains of the first transistor, the third transistor, and the fifth transistor are connected, and the eighth transistor is connected to the drains of the second transistor, the fourth transistor, and the sixth transistor;
    wherein the SRAM unit receives a 1-bit datum, temporarily stores the 1-bit datum, and transmits the 1-bit datum for normal operations; and the drains of the seventh and eighth transistors of the non-volatile memory unit stores the 1-bit datum in the SRAM unit before power is turned off (storage operation), keeps the 1-bit datum (storage operation), recovers the 1-bit datum back to the SRAM unit once the power supply is resumed (recovery operation), and erases the 1-bit after the recovery operation is completed (erase operation);
    wherein a voltage on the control gates of the split-gate transistors is higher than that a voltage on the sources of the split-gate transistors during the storage operation.

8. The non-volatile SRAM cell of claim 7, wherein the first transistor, the second transistor, the fifth transistor, and the sixth transistor are nMOSFET's, and the third transistor and the fourth transistor are pMOSFET's.

9. The non-volatile SRAM cell of claim 7, wherein the voltage on the control gates of the split-gate transistors is lower than 0V and the voltage on sources of the split-gate transistors is higher than 5V during the erase operation.

10. The non-volatile SRAM cell of claim 7, wherein the voltage on the control gates of the split-gate transistors is 0V and the voltage on the sources of the split-gate transistors is 0V during the normal operation.

11. The non-volatile SRAM cell of claim 7, wherein the voltage on the control gates of the split-gate transistors is equal to the voltage on the sources of the split-gate transistors during the recovery operation.

12. The non-volatile SRAM cell of claim 7, wherein a voltage on the word line of the SRAM unit is pulled down to a low level during the recovery operation, the erase operation, and the storage operation.

13. The non-volatile SRAM cell of claim 1, wherein the voltage on the control gates of the split-gate transistors is 0V and the voltage on the sources of the split-gate transistors is floating during the normal operation.

14. The non-volatile SRAM cell of claim 7, wherein the voltage on the control gates of the split-gate transistors is 0V and the voltage on the sources of the split-gate transistors is floating during the normal operation.

15. A non-volatile static random access memory (SRAM) cell, comprising:
   an SRAM unit, which receives a 1-bit datum, temporarily stores the 1-bit datum, and transmits the 1-bit datum for normal operations; and
   a non-volatile memory unit, which connects to the SRAM unit for storing the 1-bit datum in the SRAM unit before power is turned off (storage operation), keeping the 1-bit datum (storage operation), recovering the 1-bit datum back to the SRAM unit once the power supply is resumed (recovery operation), and erasing the 1-bit after the recovery operation is completed (erase operation), the non-volatile memory unit further including two split-gate transistors, each of the split-gate transistors including a control gate, a source and a drain, the control gates of the split-gate transistors being connected, the sources of the split-gate transistors being connected and having a same voltage level, the drains of the split-gate transistors storing the 1-bit datum in the SRAM unit;
   wherein a voltage on the control gates of the split-gate transistors is lower than 0V and a voltage on sources of the split-gate transistors is higher than 5V during the erase operation.

* * * * *